United States Patent
Wu et al.

(10) Patent No.: US 10,267,822 B2
(45) Date of Patent: Apr. 23, 2019

(54) SENSOR HAVING PARTICLE BARRIER

(71) Applicant: Hewlett-Packard Development Company, L.P., Houston, TX (US)

(72) Inventors: Jennifer Wu, Corvallis, OR (US); Rodney L. Alley, Albany, OR (US); Robert G. Walmsley, Palo Alto, CA (US); Donald J. Milligan, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 287 days.

(21) Appl. No.: 14/763,511

(22) PCT Filed: Jan. 31, 2013

(86) PCT No.: PCT/US2013/024152
§ 371 (c)(1),
(2) Date: Jul. 25, 2015

(87) PCT Pub. No.: WO2014/120206
PCT Pub. Date: Aug. 7, 2014

(65) Prior Publication Data
US 2015/0355223 A1 Dec. 10, 2015

(51) Int. Cl.
*G01P 15/125* (2006.01)
*G01P 15/08* (2006.01)
(Continued)

(52) U.S. Cl.
CPC .......... *G01P 15/125* (2013.01); *B81B 7/0029* (2013.01); *G01C 19/5769* (2013.01);
(Continued)

(58) Field of Classification Search
CPC .............. G01C 19/5769; B81B 7/0029; B81B 2201/0221; B81B 2201/0235;
(Continued)

(56) References Cited

U.S. PATENT DOCUMENTS 5,992,233 A * 11/1999 Clark ................. G01C 19/5719
361/280
6,504,385 B2 * 1/2003 Hartwell ................. G01P 15/18
324/661
(Continued)

FOREIGN PATENT DOCUMENTS

EP 1223665 7/2002
TW 200719022 5/2007

OTHER PUBLICATIONS

International Search Report, Korean Intellectual Property Office, dated Oct. 17, 2013, PCT Patent Application No. PCT/US2013/024152, 3 pages.
(Continued)

*Primary Examiner* — Robert R Raevis
(74) *Attorney, Agent, or Firm* — HP Inc. Patent Department

(57) ABSTRACT

A sensor having a particle barrier is described. In an example, a sensor includes: first and second electrode sets respectively disposed upon a planar support surface and a proof mass that is compliantly displaceable along a first axis substantially parallel to the planar support surface; and a first barrier disposed on the planar support around the first electrode set having a height less than a gap between the planar support and the proof mass to mitigate particle migration into the first or second electrode set.

18 Claims, 4 Drawing Sheets

(51) Int. Cl.
   *G01P 1/02* (2006.01)
   *G01C 19/5769* (2012.01)
   *B81B 7/00* (2006.01)

(52) U.S. Cl.
   CPC .......... *G01P 1/023* (2013.01); *G01P 15/0802* (2013.01); *B81B 2201/0221* (2013.01); *B81B 2201/0235* (2013.01); *Y10T 29/417* (2015.01)

(58) Field of Classification Search
   CPC .... G01P 15/125; G01P 15/0802; G01P 1/023; Y10T 29/417
   USPC .......................................... 73/514.01–514.38
   See application file for complete search history.

(56) References Cited

U.S. PATENT DOCUMENTS

| | | | | |
|---|---|---|---|---|
| 6,509,620 B2* | 1/2003 | Hartwell | ................ | H02N 1/006 257/415 |
| 6,761,070 B2 | 7/2004 | Zarabadi et al. | | |
| 6,854,330 B2* | 2/2005 | Potter | .................. | G01P 15/125 310/309 |
| 6,930,368 B2* | 8/2005 | Hartwell | ............... | B81B 7/0041 257/417 |
| 6,935,175 B2* | 8/2005 | Eskridge | ............... | G01P 15/125 73/514.21 |
| 7,142,500 B2* | 11/2006 | Fasen | .................. | G01D 5/2412 369/126 |
| 7,250,322 B2 | 7/2007 | Christenson et al. | | |
| 7,469,588 B2* | 12/2008 | LaFond | ............... | G01P 15/0802 73/514.32 |
| 7,531,229 B2* | 5/2009 | Gomez | ................ | B81B 7/0077 180/170 |
| 7,736,931 B1* | 6/2010 | Guo | .................... | G01P 15/0802 257/E21.613 |
| 8,656,778 B2* | 2/2014 | Guo | ...................... | G01P 15/125 73/514.32 |
| 2001/0055876 A1 | 12/2001 | Sakai et al. | | |
| 2003/0034327 A1 | 2/2003 | Kawamura et al. | | |
| 2005/0084998 A1 | 4/2005 | Horning et al. | | |
| 2006/0132701 A1 | 6/2006 | Minowa et al. | | |
| 2007/0109486 A1 | 5/2007 | Liu et al. | | |
| 2008/0006889 A1 | 1/2008 | Diamond et al. | | |
| 2009/0107238 A1* | 4/2009 | Guo | .................... | G01P 15/0802 73/514.32 |
| 2011/0140216 A1 | 6/2011 | Qu | | |
| 2012/0042729 A1 | 2/2012 | Wang | | |
| 2012/0167685 A1 | 7/2012 | Guo et al. | | |

OTHER PUBLICATIONS

Antonelli, Keith, et al. "Displacement Measurement, Linear and Angular," CRC Press LLC; 1999. 166 pages.

* cited by examiner

SENSOR HAVING PARTICLE BARRIER

CROSS-REFERENCE TO RELATED APPLICATION

This application is a U.S. National Stage Application of and claims priority to International Patent Application No. PCT/US2013/024152, filed on Jan. 31, 2013, and entitled "SENSOR HAVING PARTICLE BARRIER," which is hereby incorporated by reference in its entirety.

BACKGROUND

In the field of electronic measurement devices, it is often desirable to determine when an apparatus is physically moved or accelerated by an external force. It can also be desirable to determine the magnitude and direction of the force. To make such measurements, motion or acceleration sensing devices can be positioned on or included within an apparatus. In particular, MEMS-type sensors have been developed for inclusion in microelectronic circuits, allowing very small and accurate motion sensors to be made.

As a byproduct of the manufacture process of MEMS sensors, particles can be created inside the MEMS structure. When the MEMS sensors are operated in the field, these particles can damage sensitive electrodes used to detect motion/acceleration. The degree of damage depends on the size of the particles and can cause the MEMS sensors to produce unreliable measurements.

BRIEF DESCRIPTION OF THE DRAWINGS

Some embodiments of the invention are described with respect to the following figures.

DETAILED DESCRIPTION

Sensor having a particle barrier is described. In an example, a sensor includes first and second electrode sets respectively disposed upon a planar support surface and a proof mass that is compliantly displaceable along a first axis substantially parallel to the planar support surface. A first barrier is disposed on the planar support around the first electrode set having a height less than a gap between the planar support and the proof mass to mitigate particle migration into a space between the first and second electrode sets. In another example, the first barrier can be formed on the proof mass rather than the planar support surface. In another example, first and second barriers can be formed on the planar support surface and the proof mass. In another example, at least one trench can be formed in the planar support surface around the first barrier. In another example, at least one trench can be formed in the proof mass around a second barrier if present.

Barrier(s) on the planar support surface and/or proof mass work to mitigate particle migration into the sensitive electrode area of the sensor. The gap between electrodes on the support and proof mass can be small with respect to the particles present during manufacture. Large particles that come between electrode sets can easily damage the electrodes and deleteriously affect operation of the sensor. The barrier(s) provide a physical mechanism around the sensitive areas on the sensor to reduce or prevent migration of harmful particles into the sensitive areas. The barrier(s) can completely surround the sensitive areas of the sensor to physically separate areas on the sensor that are more likely to contain or generate particles and then reduce or prevent their migration into the sensitive areas.

Examples are described below with respect to accelerometer-type sensors and prevention of particle migration into sensitive electrode areas. It is to be understood that the invention can be applied to other types of MEMS devices. In general, the particle migration prevention techniques described herein can be employed in any MEMS device involving fine gaps between moving parts and particle sensitive areas. For example, the particle migration prevention technique can be employed in a gyroscopic sensor that includes a proof mass compliant in both axes of a plane. Examples of the invention can be understood with respect to the following figures and description.

Figure 1:
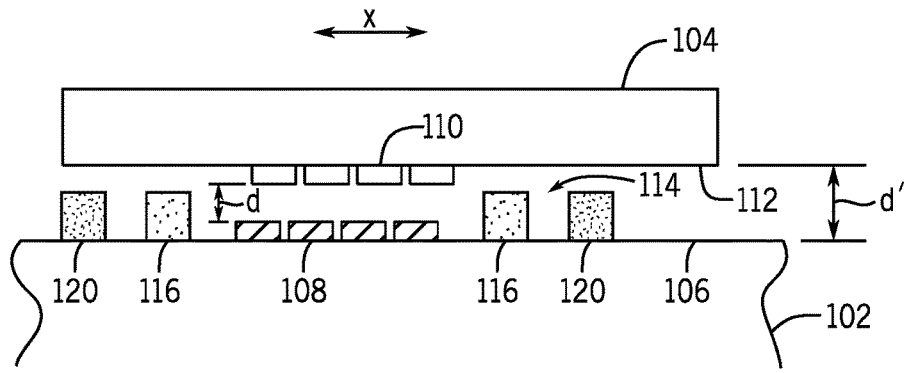
FIG. 1 is a side, cross-sectional view of a portion of a sensor.
Figure 2:
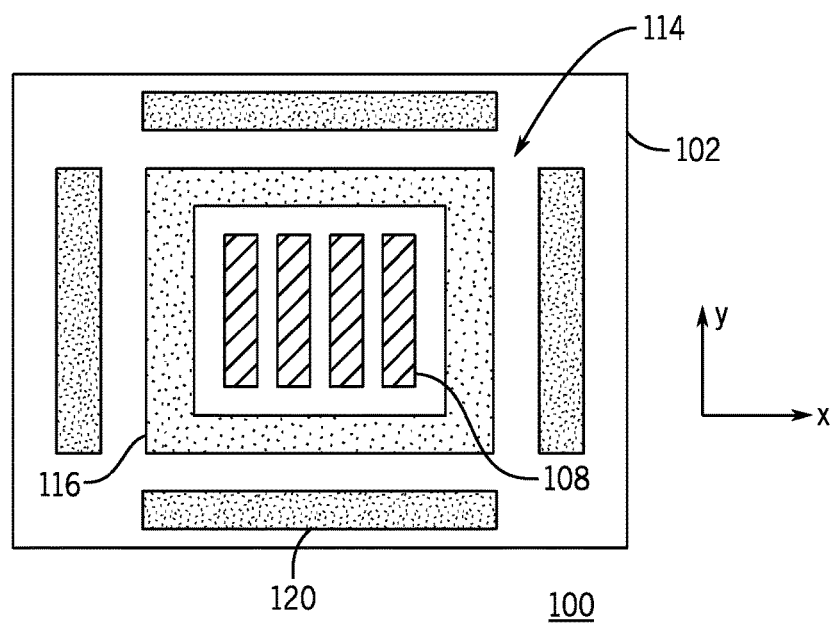
FIG. 2 is a top-down view of a portion of the sensor of FIG. 1 without a proof mass in order to show the detailed features on a substrate of the sensor.

FIGS. 1 and 2 depict a variable capacitance sensor 100 according to an example implementation. The sensor 100 includes a fixed substrate 102 and a proof mass 104 that is moveable along an axis, designated as the x axis, in a direction that is substantially parallel to a top surface 106 (also referred to as a "planar support surface") of the fixed substrate 102. An axis perpendicular to the x axis in the plane of the top surface 106 is referred to as the y axis. The substrate 102 and the proof mass 104 can be silicon wafers that are fabricated using integrated circuit fabrication techniques. FIG. 1 is a side, cross-sectional view of a portion of the sensor 100, while FIG. 2 is a top-down view of a portion of the sensor 100 of FIG. 1 without the proof mass 104 in order to show the detailed features on the substrate 102. The proof mass 104 has a home position (i.e., a position at which it is at rest when no force is applied to it), and can move in either direction along its axis of motion depending on the direction of force that is applied to the structure upon which the sensor is mounted.

The sensor 100 can be fabricated using wafer bonding techniques that enable the use of surface electrodes. A fixed electrode set 108 is attached to the top surface 106 of the substrate 102, and a moving electrode set 110 is attached to a bottom surface 112 of the proof mass 104. Each of the fixed electrode set 108 and the moving electrode set 110 can include an array of fine-pitch surface electrodes (e.g., 4 are shown). The electrode set 108 encompasses an area on the substrate 102 having a length along the x axis and a width along the y axis. Likewise, the electrode set 110 encompasses an area on the proof mass 104 having a length along the x axis and width along the y axis. The substrate 102 and the proof mass 104 can be of silicon material and can include circuitry (not shown) for interconnecting the electrodes of the substrate and proof mass to circuitry (not shown) for receiving and interpreting signals from the sensor. The fixed and moving electrodes 108, 110 are separated by a gap d, and operate as capacitor plates of a variable capacitor. Depending on the position of the proof mass 104, some portion of the moving electrode set 110 will be positioned over some portion of the fixed electrode set 108.

In an example, a barrier 114 is formed on the substrate 102 around the electrode set 108. The barrier 114 can be formed using standard silicon processing. For example, the barrier 114 can be formed by depositing various thicknesses of an oxide and etching such that a dam or barrier topography is produced. The height of the barrier 114 is less than a gap d' between the top surface 106 of the substrate 102 and the bottom surface 112 of the proof mass 104. In an example, at least one surface of the barrier 114 can be covered with metal to make it more robust. As shown, the barrier 114 reduces the gap d' between the substrate 102 and the proof mass 104 to mitigate the migration of particles into the electrodes 108, 110.

In an example, as shown in FIGS. 1 and 2, the barrier 114 can include elongated segments 116 that completely surround the electrode set 108 (e.g., the segments 116 that extend the length and width of the electrode set 108 plus some buffer). In an example, the barrier 114 can include additional elongated segments 120 disposed on the substrate 102 spaced apart from the segments 116 and surrounding the segments 116 and the electrode set 108. Such an example provides a "double barrier" on the substrate 102. In an example, segments of the barrier 114 can completely surround the electrode set 108 (e.g., the segments 116). In another example, the barrier 114 can have breaks between segments (e.g., the segments 120). For example, breaks between segments of the barrier 114 can be added as necessary so as to not interfere with other features on the sensor 100 (e.g., routing of conductors).

By way of example, FIGS. 1 and 2 show a barrier 114 having two sets of segments that surround the electrode set 108 (e.g., a "double barrier"). It is to be understood that the barrier can include any number of sets of segments arranged in concentric fashion around the electrode set 108. Each set of segments may or may not have one or more breaks. Furthermore, although FIGS. 1 and 2 show a barrier 114 around a single set of electrodes, it is to be understood that a sensor or other similar MEMS device can include multiple particle-sensitive areas and thus multiple barriers surrounding such areas. Furthermore, although FIGS. 1 and 2 show a barrier 114 around the electrode set 108 on the substrate 102, it is to be understood that the barrier 114 can be formed on the proof mass 104 around the electrode set 110 instead. Examples below describe a sensor having a barrier on both the substrate 102 and the proof mass 104.

Figure 3:
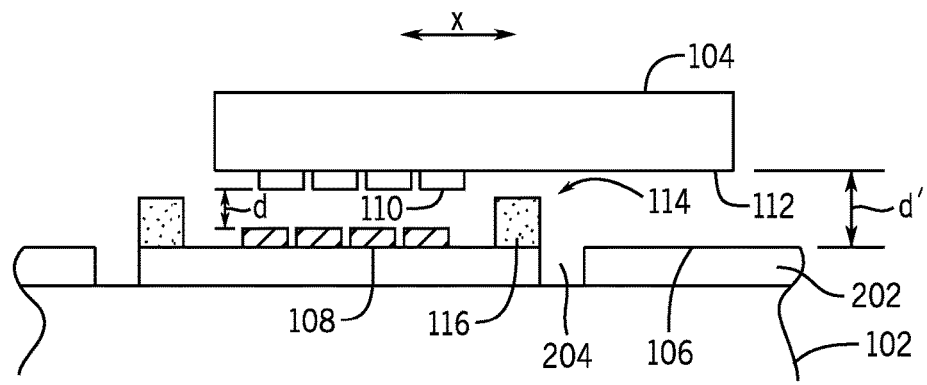
FIG. 3 is a side, cross-sectional view of a portion of a sensor according to another example implementation.
Figure 4:
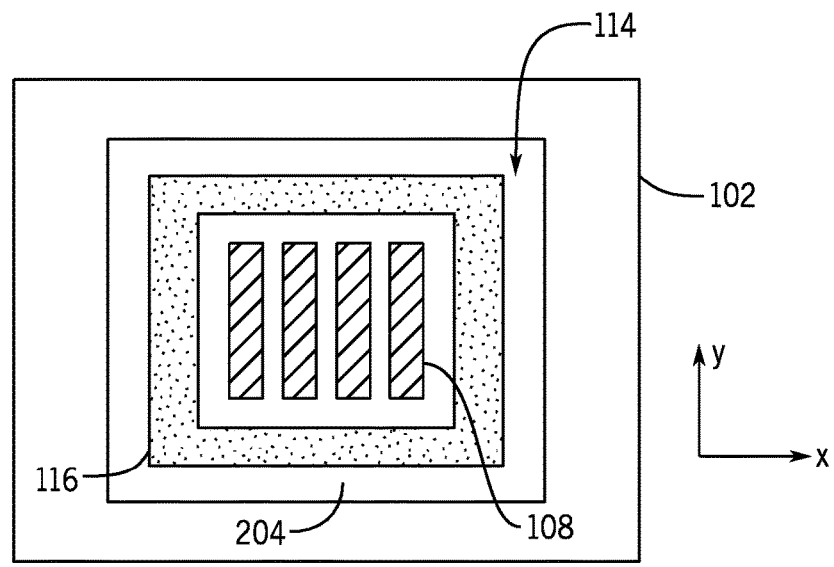
FIG. 4 is a top-down view of a portion of the sensor of FIG. 3 without the proof mass in order to show the detailed features on the substrate of the sensor.

FIG. 3 is a side, cross-sectional view of a portion of a sensor 200 according to an example implementation. FIG. 4 is a top-down view of a portion of the sensor 200 shown in FIG. 3 without the proof mass 104 in order to show the detailed features on the substrate 102. Elements in FIGS. 3 and 4 that are the same or similar to those of FIGS. 1 and 2 are designated with identical reference numerals and are described above. The substrate 102 can include various layers. In the present example, a top layer 202 of the substrate 102 is shown. The top layer 202 can include an insulating layer, such as glass or Tetraethyl Orthosilicate (TEOS) glass. In addition to the barrier 114, a trench 204 can be formed around the electrode set 108. The trench 204 can be formed in the top layer 202 outside and around the barrier 114. The trench 204 can increase the step-height of the barrier 114 to increase its effectiveness at mitigating particles, and can itself act as a trap for particles.

Figure 5:
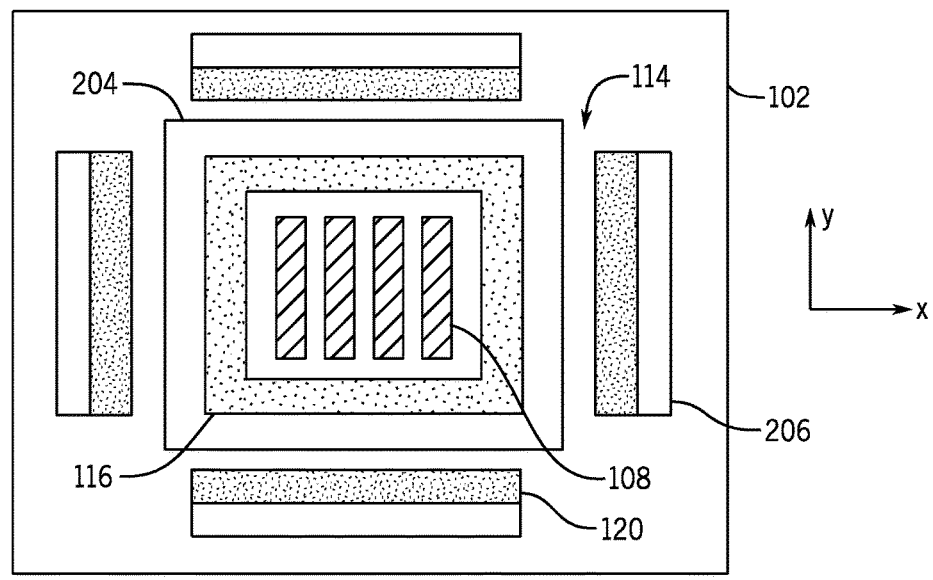
FIG. 5 shows a top-down view of the sensor of FIG. 1 having additional features.

In the example of FIG. 3, the barrier 114 is shown as having only the elongated segments 116. In examples where the barrier 114 includes the additional segments (e.g., the segments 120 shown in FIGS. 1 and 2), additional trenches can be formed in front of each of the additional segments similar to the trench 204. That is, a plurality of trenches can be formed on the substrate surrounding each set on concentric set of segments of the barrier 114 resulting in a set of concentric trenches. Similar to the segments of the barrier 114, a given trench can be continuous or can have breaks. For example, FIG. 5 shows a top-down view of the sensor 100 having trenches that cooperate with each of the segments 116, 120 of the barrier 114. The trench 204 cooperates with the segment set 116 of the barrier 114, and a trench 206 cooperates with the segment set 120 of the barrier 114. In the example, the trench 206 includes breaks that coincide with the breaks in the segment set 120 of the barrier 114.

In the examples of FIGS. 3-5 above, trench(es) can be added around segment set(s) of the barrier 114 on the substrate 102. It is to be understood that similar trenches can be formed around segment set(s) of a barrier on the proof mass 104 if such a barrier is present. Furthermore, in some examples, if the barrier 114 has multiple concentric segment sets, then some of those segment sets can have an associated trench and some other segment sets may not have an associated trench. Furthermore, although a given segment set of the barrier 114 may have no breaks, an associated trench may have breaks as necessary. Furthermore, although the trench 204 and the trench 206 are shown aligned with the edges of segments in the barrier 114, it is to be understood that the trench(es) 204 and/or 206 can be spaced apart from the edges of their respective segments.

Figure 6:
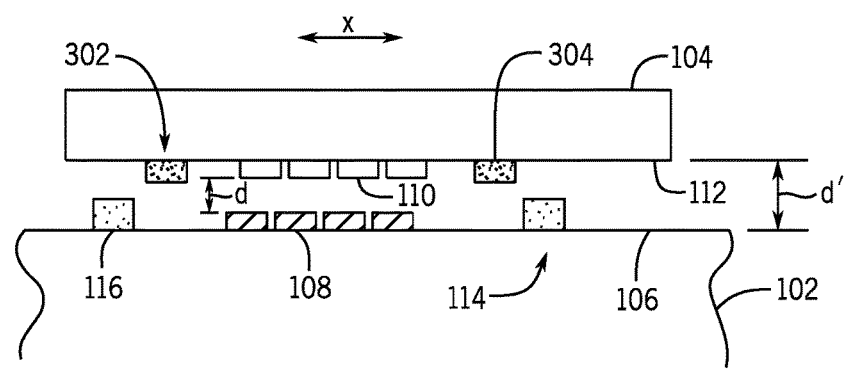
FIG. 6 is a side, cross-sectional view of a portion of a sensor according to another example implementation.

FIG. 6 is a side, cross-sectional view of a portion of a sensor 300 according to an example implementation. Elements of FIG. 6 that are the same or similar to those of FIGS. 1 and 2 are designated with identical reference numerals and are described above. In the present example, a barrier 302 is formed on the proof mass 104 around the electrode set 110 in addition to the barrier 114 around the electrode set 108. The barrier 302 can be formed using standard silicon processing. For example, the barrier 302 can be formed by depositing various thicknesses of an oxide and etching such that a dam or barrier topography is produced. The height of the barrier 302 is less than a gap d' between the top surface 106 of the substrate 102 and the bottom surface 112 of the proof mass 104. In an example, at least one surface of the barrier 302 can be covered with metal to make it more robust. As shown, the barrier 302 reduces the gap d' between the substrate 102 and the proof mass 104 to mitigate migration of particles into the electrodes. In an example, the barrier 302 can cooperate with the barrier 114 to further mitigate particle migration.

Similar to the barrier 114, the barrier 302 can include one or more sets of segments (e.g., a single set of segments 304 are shown) around the electrode set 110. The barrier 302 can include the same number or different number of concentric segment sets than the barrier 114. Similar to the barrier 114, segment sets in the barrier 302 can have breaks between segments or can be continuous. Furthermore, in some examples, trench(es) can be formed in the substrate 102 and/or the proof mass 104 associated with the segment set(s) of the barriers 114 and/or the barrier 302.

Figure 7:
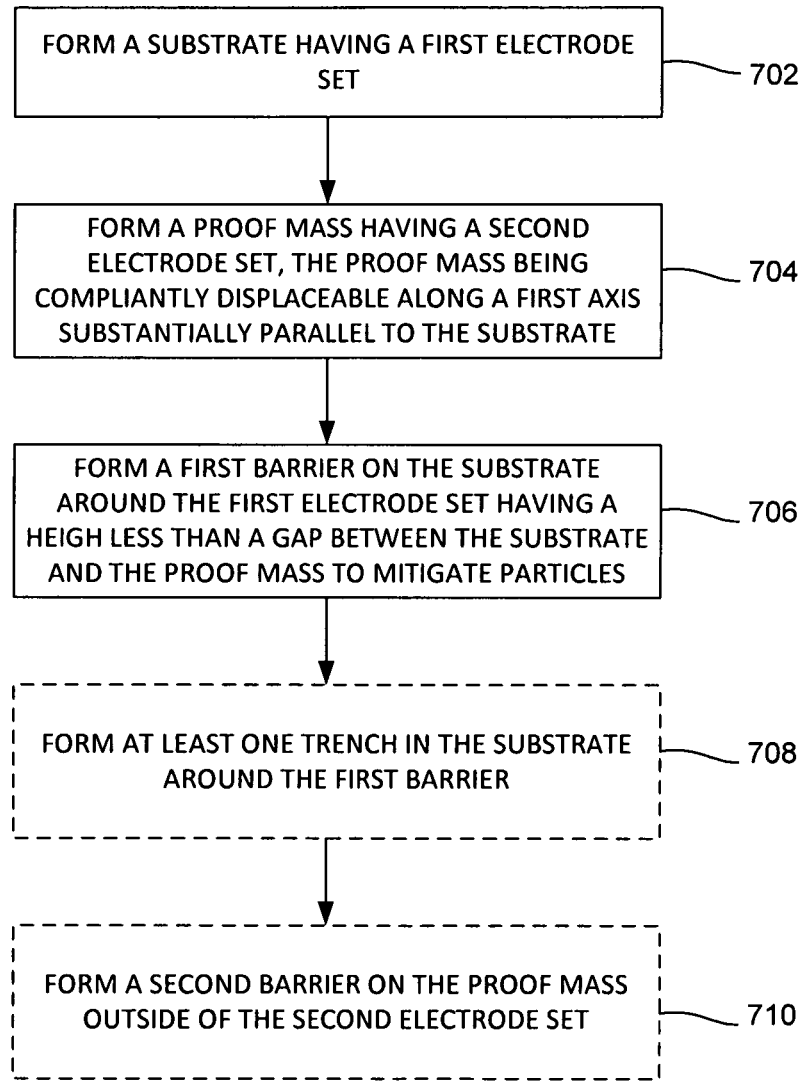
FIG. 7 is a flow diagram depicting a method of making a sensor according to an example implementation.

FIG. 7 is a flow diagram depicting a method 700 of making a sensor according to an example implementation. It is to be understood that the steps of the method 700 do not necessarily have to be performed in the specific order shown. The method 700 begins at step 702, where a substrate is formed having a first electrode set disposed thereon. At step 704, a proof mass is formed having a second electrode set, where the proof mass is compliantly displaceable along a first axis substantially parallel to the substrate. At step 706, a first barrier is formed on the substrate around the first electrode set having a height less than a gap between the substrate and the proof mass to mitigate particles.

In an example, at step 708, at least one trench can be formed in the substrate around the first barrier. In another example, at step 710, a second barrier is formed on the proof mass outside the second electrode set having at least one elongated segment oriented parallel to the first axis and having a height less than the gap between the substrate and the proof mass.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A sensor, comprising:
   first and second electrode sets respectively disposed upon a planar support surface of a planar support and a proof mass that is compliantly displaceable along a first axis substantially parallel to the planar support surface; and
   a first barrier disposed on the planar support surface around the first electrode set having a height less than a gap between the planar support and the proof mass to mitigate particle migration into the first or second electrode sets, wherein the first barrier comprises
   a first elongated segment set disposed on the planar support surrounding the first electrode set; and
   a second elongated segment set disposed on the planar support and spaced apart from and surrounding the first elongated segment set.

2. The sensor of claim 1, further comprising:
   a trench formed in the planar support around the first barrier.

3. The sensor of claim 1, further comprising:
   a second barrier disposed on the proof mass outside of the second electrode set having a height less than the gap between the planar support and the proof mass.

4. The sensor of claim 3, further comprising:
   a trench formed in the proof mass around the second barrier.

5. The sensor of claim 1, wherein at least one of the first or second elongated segment set includes at least one break between segments.

6. The sensor of claim 1, wherein the first barrier surrounds a plurality of sides of the first electrode set, the first electrode set comprising electrodes.

7. The sensor of claim 6, wherein the first barrier has a plurality of segments arranged along respective sides of the plurality of sides of the first electrode set.

8. The sensor of claim 7, wherein the plurality of segments of the first barrier extend continuously completely around the first electrode set.

9. The sensor of claim 7, wherein breaks are provided between the plurality of segments of the first barrier.

10. A method of making a sensor, comprising:
    forming a substrate having a first electrode set disposed thereon, the first electrode set comprising a plurality of electrodes;
    forming a proof mass having a second electrode set, the second electrode set comprising a plurality of electrodes, the proof mass being moveable along a first axis relative to the substrate; and
    forming a first barrier on the substrate that surrounds the first electrode set, the first barrier having a height less than a gap between the substrate and the proof mass to mitigate particle migration into the first or second electrode sets, wherein the first barrier comprises:
    a first elongated segment set disposed on the substrate surrounding the first electrode set; and
    a second elongated segment set disposed on the substrate spaced apart from and surrounding the first elongated segment set.

11. The method of claim 10, further comprising:
    forming at least one trench in the substrate around the first barrier.

12. The method of claim 10, further comprising:
    forming a second barrier on the proof mass outside of the second electrode set having a height less than the gap between the substrate and the proof mass.

13. The method of claim 12, further comprising:
    forming at least one trench in the proof mass around the second barrier.

14. The method of claim 10, wherein at least one of the first elongated segment set or the second elongated segment set includes a break between segments.

15. The method of claim 10, wherein forming the first barrier comprises forming the first barrier that surrounds a plurality of sides of the first electrode set.

16. The method of claim 15, wherein forming the first barrier comprises forming the first barrier that includes a plurality of segments that extend along respective sides of the plurality of sides of the first electrode set.

17. A sensor comprising:
    a substrate;
    a proof mass that is moveable along an axis relative to a surface of the substrate;
    first and second electrode sets respectively disposed upon the substrate and the proof mass, the first electrode set comprising a plurality of electrodes, and the second electrode set comprising a plurality of electrodes;
    a barrier disposed on the surface of the substrate and surrounding a plurality of sides of the first electrode set, the barrier having a height less than a gap between the substrate and the proof mass to mitigate particle migration into the first electrode set or second electrode set; and
    a trench formed in the substrate around the barrier, the trench extending into the substrate below the surface of the substrate.

18. The sensor of claim 17, wherein the barrier comprises a plurality of segments arranged along respective sides of the plurality of sides of the first electrode set.

* * * * *